United States Patent

Matsuzaki et al.

[11] Patent Number: 4,949,137
[45] Date of Patent: Aug. 14, 1990

[54] SEMICONDUCTOR DEVICE

[75] Inventors: Hitoshi Matsuzaki, Mito; Kiyoshi Tukuda, Hitachi; Toshikatsu Shirasawa, Hitachiota; Hideki Miyazaki, Hitachi, all of Japan

[73] Assignee: Hitachi, Ltd., Tokyo, Japan

[21] Appl. No.: 358,880

[22] Filed: May 31, 1989

[30] Foreign Application Priority Data

Jun. 1, 1988 [JP]  Japan ................. 63-132741

[51] Int. Cl.⁵ .......................... H01L 29/78
[52] U.S. Cl. .................. 357/23.4; 357/41; 357/51; 357/49
[58] Field of Search ............ 357/23.4, 41, 49, 51

[56] References Cited

U.S. PATENT DOCUMENTS 4,553,084 11/1985 Wrathall ........................... 323/316
4,831,424 5/1989 Yoshida et al. ................... 357/23.4

Primary Examiner—Edward J. Wojciechowicz
Attorney, Agent, or Firm—Antonelli, Terry, Stout & Kraus

[57] ABSTRACT

A semiconductor device comprises a heavily doped semiconductor layer exposed to both principal surfaces of a semiconductor substrate, a semiconductor element such as a diode, a bipolar transistor, and a MOS transistor, etc. formed on one principal surface side of the semiconductor substrate, a resistor region connected in series with the semiconductor element on the other principal surface side of the semiconductor substrate, and an electrode for current detection kept in contact with the semiconductor layer on the one principal surface side.

7 Claims, 3 Drawing Sheets

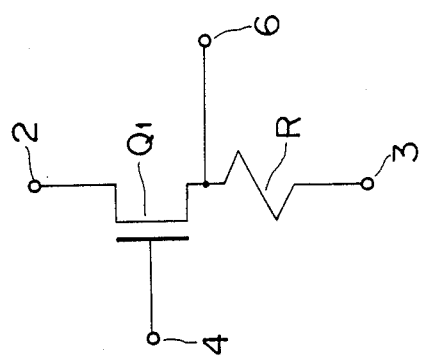
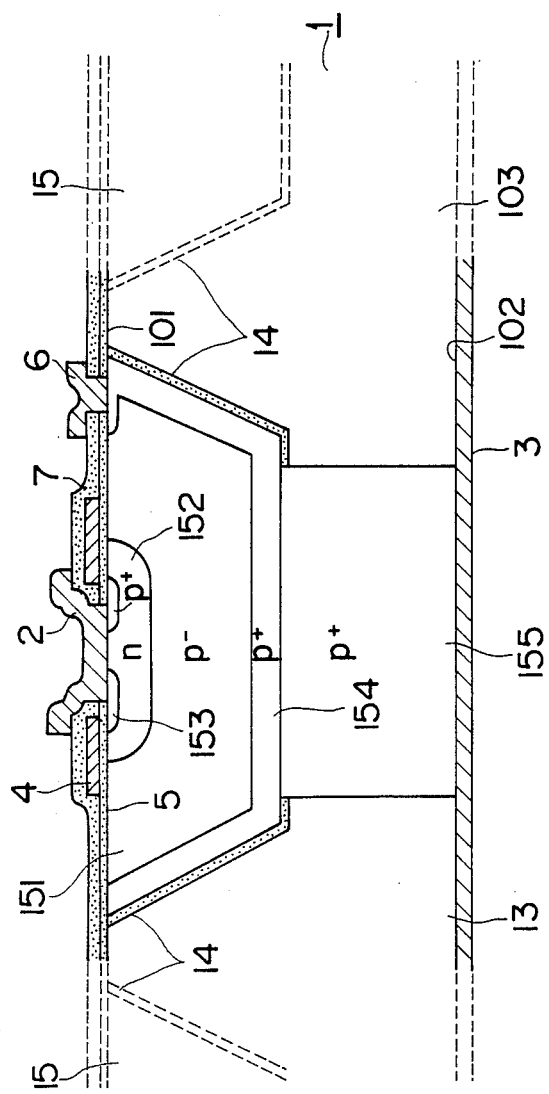

SEMICONDUCTOR DEVICE

BACKGROUND OF THE INVENTION

The present invention relates to a power semiconductor device and more particularly to a semiconductor device having a function of detecting a current.

Current detection has been eagerly demanded in the application of the power semiconductor device. The current flowing through the semiconductor device is detected to carry out several controls such as excess current detection for device protection, constant current control, etc. There have been proposed, as a technique for current detection, (1) a method for measuring a voltage across a resistor externally provided in series with a power semiconductor device, and (2) a method of detecting a shunting current (e.g. about 1/1000) of the current flowing through a power MOS transistor using an externally provided resistor, which is disclosed in U.S. Pat. No. 4,553,084.

However, both of the methods mentioned above have the following disadvantages. The method (1) has disadvantages of serious loss due to the externally provided resistor and necessity thereof. The method (2) can relax the loss due to the externally provided resistor as compared with the method (1) since the shunting current is detected, but still has disadvantages of being substantially limited, as the power semi-conductor device, to a power MOS transistor in relation to the shunting ratio, and also of necessity of the externally provided resistor. The externally provided resistor should have a small resistance value in order to reduce the loss, and in the contrary, should have a large resistance value in order to eliminate variations in resistance due to its connection to realize the enhanced detection accuracy. It is impossible to simultaneously satisfy both requirements since they are contradictory. In recent years, there has been a tendency of constructing a circuit of controlling a high power in an IC (referred to a power IC or intelligent power IC). The externally provided resistor disadvantageously goes against such a tendency.

SUMMARY OF THE INVENTION

An object of the present invention is to provide a new semiconductor device free from the above problems, and more concretely to provide a semiconductor device which is capable of detecting the conducting current without using an externally provided resistor.

Another object of the present invention is to provide a semiconductor device structure suitable to be integrated.

In order to attain the above objects, a feature of a semiconductor device in accordance with the present invention resides in that a semiconductor device is formed in a semiconductor substrate so that a main current flows from one principal surface of a semiconductor substrate to the other principal surface thereof, and also a resistor region is formed in series with the semiconductor device within the semiconductor substrate.

More specifically, the feature of the semiconductor device in accordance with the present invention resides in that a heavily doped (high impurity concentration) first semiconductor layer exposed to both principal surfaces of a semiconductor substrate is formed, and a semiconductor device and a resistor region are formed on the one principal side and the other principal side of the first semiconductor layer, respectively. An electrode for current detection is kept in ohmic contact with the first semiconductor layer on the one principal surface of the semiconductor substrate. The semiconductor device formed in the first semiconductor layer may be a diode, a bipolar transistor, a MOS transistor, etc. The semiconductor substrate may be a substrate consisting of only areas where a semiconductor device and a resistor region are formed, a substrate having a plurality of semiconductor regions electrically isolated using p-n junctions where elements other than the semiconductor device and the resistor region can be also formed, and a substrate having a plurality of semiconductor regions electrically isolated using dielectrics where elements other than the semiconductor device and the resistor region can be also formed.

In accordance with the present invention, formed in the same semiconductor substrate are a semiconductor device region, which is adapted to pass a main current from one principal surface to the other principal surface, and a resistor region of a heavily doped semiconductor which is formed between the semiconductor device region and either one of the principal surfaces so that the main current flowing through the semiconductor device region flows through the resistor region as it is. Thus, the main current can be detected from the voltage drop in the resistor region, which is extracted from an electrode for current detection, and the resistance value of the resistor region. Further, the resistor region has a high impurity concentration and is adapted to pass the main current from the one principal surface of the semiconductor substrate to the other principal surface thereof so that the resistance value of the resistor region can be limited to a very small value as small as $0.05\ \Omega$ or so and hence loss due to the resistor region can be restrained. Moreover, the resistor region can be fabricated using a technique for fabricating a semiconductor device and there is not a connection resistance between the resistor region and the semiconductor region so that the resistance value of the resistance region can be accurately set at a value to be set, which permits the current detection to be performed with high accuracy.

BRIEF DESCRIPTION OF THE DRAWINGS

FIG. 1 is a schematic sectional view showing one embodiment of a semiconductor device in accordance with the present invention;

FIG. 2 is an equivalent circuit diagram of the semiconductor device of FIG. 1;

DESCRIPTION OF THE PREFERRED EMBODIMENTS

Figure 3A:
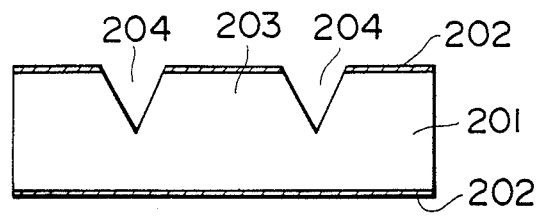
FIGS. 3A to 3D are schematic sectional views for explaining a method for fabricating a dielectric isolated substrate employed for the semiconductor device of FIG. 1.

Now referring to the drawings, the semiconductor device in accordance with the present invention will be explained in its structure and fabricating method in connection with several embodiments thereof.

FIG. 1 shows one embodiment of the present invention in which a vertical MOS transistor in accordance with the present invention is partially formed in an integrated circuit device using a dielectric-isolated substrate.

In FIG. 1, 1 is a dielectric-isolated substrate consisting of a poly-crystalline region 103 and a plurality of single crystal island regions 15 which are embedded in the poly-crystalline region 103 through dielectric films 14 so that their surface is exposed to one principal surface of the substrate. One of the single crystal islands 15 is constructed so that its bottom penetrates through the dielectric film 14 so as to extend to the other principal surface of the substrate, and a vertical MOS transistor having a current detection electrode is formed in the single crystal island region 15.

The single crystal island region 15 comprises p-type drain layer 151, an n-type layer 152, a p-type source layer 153, a heavily doped p-type layer 154, and a heavily doped p-type penetrating layer 155. The p-type drain layer 151 is exposed to the one principal surface 101 and has a decresing sectional area in parallel to the one principal surface 101 with a further distance from the one principal surface 101. The n-type layer 152 is embedded in the drain layer 151 so as to be exposed to the one principal surface 101. The p-type source layer 153 is embedded in the n-type layer 152 so as to be exposed to the one principle surface 101. The heavily doped p-type layer 154 is formed entirely between the drain layer 151 and the dielectric film 14 and on the entire bottom opposite to the one surface 101 of the drain layer 151. The heavily doped p-type penetrating layer 155 is formed between a part of the p-type layer 154 located at the bottom of the drain layer 151 and the other principal surface 102 so as to connect them.

2 is a source electrode kept in contact with the source layer 153 and the n-type layer 152 on the one principal surface 101. 3 is a drain electrode kept in contact with the other principal surface. 4 is a gate electrode formed, through a gate oxide film 5, on a part of the n-type layer 152 located between the source layer 153 and the drain layer 151. 6 is a current detection electrode kept in contact with the p-type layer 154 on the one principal surface 101. 7 is an insulating film formed on the gate electrode 4 and the gate oxide film 5.

Such an arrangement provides a circuit arrangement as shown in FIG. 2 in which a vertical MOS transistor Q, and a resistor R provided at its drain which is mainly formed by the p-type penetrating layer 155 are integrated in the manner of an integrated circuit. Reference symbols of the terminals in FIG. 2 refer to like reference symbols of the electrodes in FIG. 1.

In operation of this embodiment under the condition where the source electrode 2 has been set at a positive potential and the drain electrode 3 has been set at a negative potential, if a negative gate potential is applied to the gate electrode 4, the region between the source electrode 2 and the drain electrode 3 turns on and if the gate potential is removed, it turns off. The drain current flows through the p-type penetrating layer 155 in the on-state so that it provides a slight voltage drop in the p-type penetrating layer 155. This voltage drop can be externally extracted from the current detection terminal 6 through the p-type layer 154. The voltage appearing at the current detection terminal 6 is proportional to the drain current since the resistance value in the p-type penetrating layer 155 is fixed. Thus, the current flowing the semiconductor device can be detected without using an externally provided resistor and also with higher accuracy than the case where the externally provided resistor is employed. The p-type penetrating layer 155 is heavily doped enough to be in ohmic contact with the drain electrode 3 and so its resistance is on the order of $10^{-2} \Omega$, which is extremely smaller than the conventional externally-provided resistor (the smallest resistance among commercially available resistors is $1\Omega$). Thus, the loss due to the resistor can be remarkably reduced. The resistance value of the p-type penetrating layer 155 is preferably e.g. 10–30 m$\Omega$. The resistance value is also required to have a small variation among lots of the semiconductor devices, etc. The resistance value R is expressed by $$R = \frac{1}{S} \rho \times L$$

where
S: an area of the p-type penetrating layer,
L: a length thereof,
$\rho$: a resistivity thereof The area S, which is an area of the portion where an insulating film 206 is removed in the fabricating process described later, can be set with very high accuracy since it is removed by a photoetching technique using a photo-mask. The length L can also be set with high accuracy since it can be controlled by grinding. Further, the resistivity $\rho$ can be controlled with high accuracy by adjusting the dopant gas in an epitaxial growth in the fabricating process described later. Thus, through the dielectric isolation process the current detection resistor with high precision can be incorporated in the semiconductor device and also the current detection terminal 6 can be easily extracted.

The current detection function, which can be provided only by changing the mask at the portion of the current detection electrode 6, does not provide any step to be added to the conventional dielectric isolation process.

A method for fabricating the semiconductor device of FIG. 1 will be explained with reference to FIGS. 3A to 3D.

First, a thermal-oxidized film 202 is formed on the entire surface of a single crystal silicon 201 having a crystal face orientation of (100). Isolation grooves 204 surrounding a region where the semiconductor device is to be formed are formed (FIG. 3A). The isolation groove 204 are formed in such a manner that the thermal-oxidized film 202 is selectively etched through an ordinary photoetching technique and the silicon 201 is etched by an alkaline etchant using the remaining thermal-oxidized film 202 as a mask.

Figure 3B:
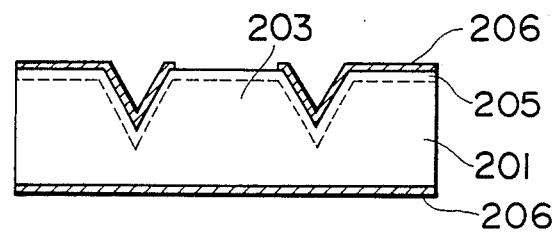

Next, the thermal oxidized film 202 is removed and a heavily doped ($1 \times 10^{19}$cm$^{-3}$ or more) layer 205 having the same conduction type as the single crystal silicon 201 is formed at least on the surface where the isolation grooves are formed. And further, an insulating film (e.g. thermal oxidized film) 206 for isolation is formed on the entire surface of the single crystal silicon 201. Removed is the insulating film 206 located at the region where a high voltage device is to be formed in the region where the device is to be formed (FIG. 3B).

Figure 3C:
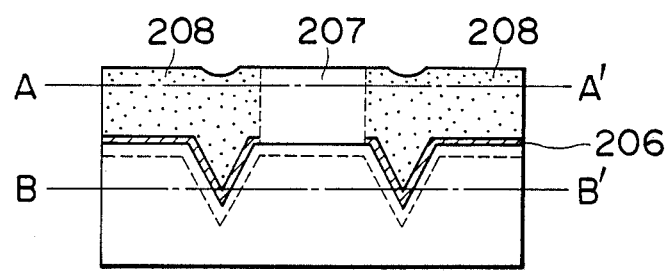

Silicon layers 207 and 208 having the same conduction type as the single crystal silicon 201 are epitaxially grown on the surface where the isolation grooves 204 have been formed (FIG. 3C). Then, the single crystal 207 is grown on the portion of the device forming region 203 where the insulating film 206 has been removed whereas the poly-crystalline silicon 208 is grown on the remaining insulating film 206. By adjusting the dopant gas during the epitaxial growth, the resistivity of the epitaxial layers 207 and 208 can be controlled with high accuracy and also the thickness thereof can be easily controlled.

Figure 3D:
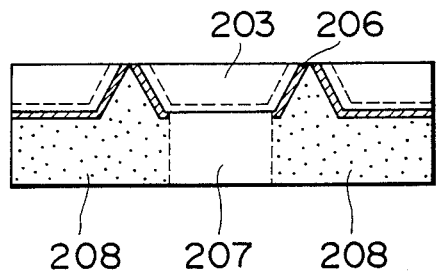

Thereafter, the resultant structure is ground from both sides up to A—A' line and B—B' line in FIG. 3C by means of a known technique. Thus, completed is a dielectric-isolated substrate in which, in the device forming region 203, the region where the high voltage device is to be formed and the other regions are completely electrically isolated from each other (FIG. 3D).

The semiconductor device of FIG. 1 can be provided by forming, in the region where the high voltage device is to be formed, the n-type layer 152 and the source layer 153, and further the source electrode 2, the drain electrode 3 and the gate electrode 5.

Figure 4:
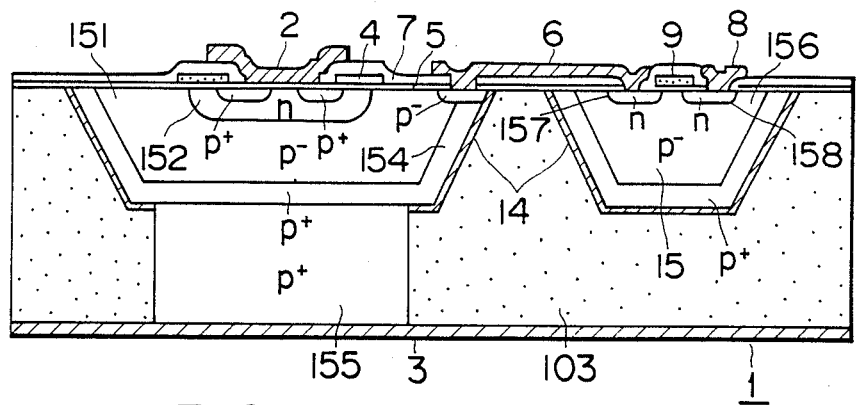
FIG. 4 is a schematic sectional view showing another embodiment of a semiconductor device in accordance with the present invention.

FIG. 4 shows another embodiment of the present invention in which the same vertical MOS transistor as that shown in FIG. 1 is formed in one single crystal island region 15 of the dielectric-isolated substrate 1 and a control section for the vertical MOS transistor is formed in an adjacent single crystal island region 15. The control section is constructed by an n-channel MOS transistor in which a source layer 157 and a drain layer 158 are in a p-type single crystal island region 156. A current detection electrode 6 for the vertical MOS transisor is kept in contact with the source layer 157. 8 is a drain electrode kept in ohmic contact with the drain layer 158. 9 is a gate electrode.

In the arrangement mentioned above, an output signal from the current detection electrode 6 is sent to the n-channel MOS transistor to carry out such controls as excess current detection, constant current chopper, etc. And by applying an output from the control section to the gate electrode 4 of the vertical MOS transistor, the vertical MOS transistor can be on-off controlled. Thus, the excess current detection and the constant current chopper control can be performed in one-chip.

Figure 5A:
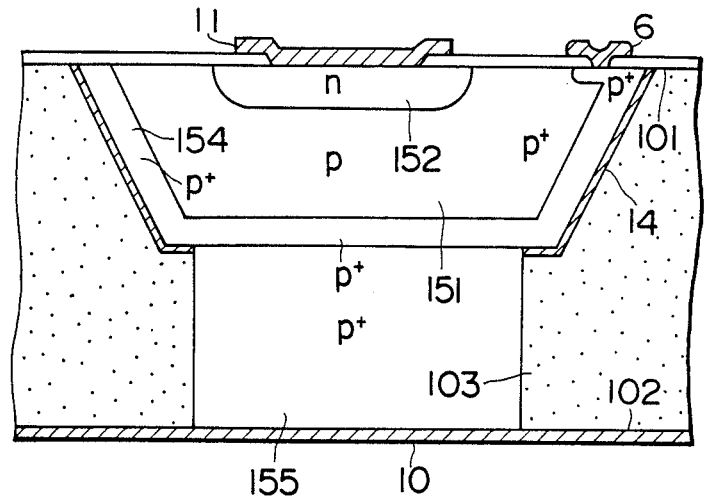
FIG. 5A is a schematic sectional view showing still another embodiment of the present invention.
Figure 5B:
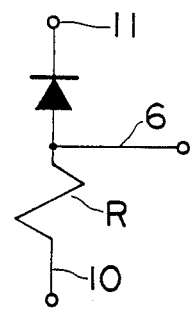
FIG. 5B is an equivalent circuit diagram of FIG. 5A.

FIG. 5A shows still another embodiment of the present invention in which a diode in place of the vertical MOS transistor is formed in one single crystal island region 15 of the dielectric-isolated substrate 1. FIG. 5B is an equivalent circuit diagram of FIG. 5A. The arrangement of this embodiment is equivalent to an arrangement in which in the vertical MOS transistor of FIG. 1, the source layer 153 and the gate electrode 4 are removed and the n-type layer 152 is heavily doped. 10 is an anode electrode kept in contact with the p-type penetrating layer 155 and 11 is a cathode electrode kept in ohmic contact with the n-type layer 152. The operation of current detection in this embodiment is the same as in the emboidment of FIG. 1.

Figure 6:
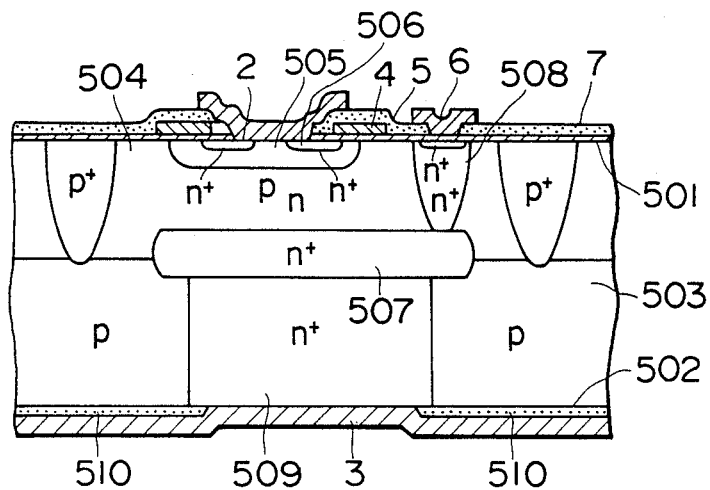
FIG. 6 is a schematic sectional view showing a further embodiment or the present invention.

FIG. 6 shows a further embodiment of the present invention in which the present invention is applied to a semiconductor device adopting a p-n junction isolation-system.

In FIG. 6, 50 is a semiconductor substrate having an n-type island region 504 provided on the side of one principal surface 501 thereof so as to be p-n isolated in a p-type region 503. A p-type layer 505 exposed to one principal surface 501 is formed in one n-type island region; an n-type source layer 506 exposed to the one principal surface 501 is formed in the p-type layer 505; an n+-type embedded layer 507 is formed in the bottom of the device; and an n+-type region 508 coupling the n+-type embedded layer 507 and the one principal surface 501 is also formed in the substrate 50. A heavily doped n-type penetrating layer 509 is formed between the n+-type embedded layer 507 and the other principal surface 502 of the substrate 50. 2 is a source electrode kept in ohmic contact with the source layer 506 and the p-type layer 505. 3 is a drain electrode kept in ohmic contact with an exposed surface of the n-type penetrating layer 509. 4 is a gate electrode. 6 is a current detection electrode kept in ohmic contact with the n+-type region 508. 5 is a gate oxide film. 7 and 510 are an insulating film. Also in this embodiment, the operation of current detection is the same as in the embodiment of FIG. 1.

Although typical embodiments of a semiconductor device in accordance with the present invention have been explained, it should be understood that various modifications cna be made.

In accordance with the present invention, current detection of a power device can be carried out with low loss and with high accuracy. Therefore, a power monolithic IC having functions of excess current protection and constant current chopper can be realized in one chip.

We claim:

1. A semiconductor device comprising:
   a semiconductor substrate including, between its first and second principal surface,
   a first semiconductor layer of a first conduction type extending from the first principal surface toward the second principal surface,
   a second semiconductor layer of the first conduction type having substantially the same impurity concentration as said first semiconductor layer, said second semiconductor layer extending from the second principal surface toward the first principal surface so as to be adjacent to said first semiconductor layer to form a first boundary,
   a third semiconductor layer of the first conduction type having a lower impurity concentration than said first semiconductor layer, said third semiconductor layer being adjacent to said first principal surface and extending into said first semiconductor layer, and
   a fourth semiconductor layer of a second conduction type having a higher impurity concentration than said third semiconductor layer, said fourth semiconductor layer being adjacent to said first principal surface and extending into said third semiconductor layer;
   a first main electrode kept in ohmic contact with said fourth semiconductor layer on said first principal surface;
   a second main electrode kept in ohmic contact with said second semiconductor layer on said second principal surface; and
   a current detection electrode kept in ohmic contact with said first semiconductor layer on said first principal surface,
   wherein a potential drop in a main current flowing through said second semiconductor layer is detected using said current detection electrode so that the main current flowing between said both principal electrodes can be detected 2. A semiconductor device according to claim 1, wherein said semiconductor substrate has a plurality of semiconductor single crystal regions electrically isolated by dielectrics, one of the plurality of semiconductor single crystal regions is formed so as to be adjacent to said first and second principal surfaces, and said first, second, third and fourth semiconductor layers are formed within said one semiconductor single crystal region.

3. A semiconductor device according to claim 1, wherein said semiconductor substrate has a plurality of semiconductor single crystal regions electrical isolated by p-n junction, one of the plurality of semiconductor single crystal regions is formed so as to be adjacent to said first and second principal surfaces, and said first, second, third and fourth semiconductor layers are formed within said one semiconductor single crystal region.

4. A semiconductor device comprising:
a semiconductor substrate including, between its first and second principal surface,
a first semiconductor layer of a first conductor type formed to be exposed to said both principal surfaces,
a second semiconductor layer of the first conduction type having a lower impurity concentration than said first semiconductor layer, said second semiconductor layer extending into said first semiconductor layer to be exposed to said first principal surface, and
a third semiconductor layer of a second conduction type extending into said second semiconductor layer so as to be exposed to said first principal surface;
a first main electrode kept in ohmic contact with said third semiconductor layer on said first principal surface of said semiconductor substrate;
a second main electrode kept in ohmic contact with said first semiconductor layer on said second principal surface of said semiconductor substrate;
a current detection electrode kept in ohmic contact with said first semiconductor layer on said first principal surface of said semiconductor substrate,
wherein a potential drop in a main current flowing through said first semiconductor layer between said second principal surface and said second semiconductor layer is detected using said current detection electrode so that the main current flowing between a pair of said main electrodes can be detected.

5. A semiconductor device according to claim 4, further comprising
a fourth semiconductor layer of the first conduction type extending into said third semiconductor layer so as to be exposed to said first principal surface;
said first main electrode also kept in ohmic contact with said first fourth semiconductor layer; and
a control electrode provided through an insulator on said third semiconductor layer located between said fourth and second semiconductor layer so as to be exposed to said first principal surface.

6. A semiconductor device according to claim 5, wherein said semiconductor substrate has a plurality of semiconductor single crystal regions electrically isolated by dielectrics, one of the plurality of semiconductor single crystal regions is formed so as to be adjacent to said first and second principal surfaces, and said first, second, third and fourth semiconductor layers are formed within said one semiconductor single crystal region 7. A semiconductor device according to claim 6, wherein formed in the other semiconductor crystal region is a control circuit for controlling the semiconductor device comprising said first, second, third and fourth semiconductor layers, said first and second main electrodes and said control electrode.

* * * * *